(12) United States Patent
Yao et al.

(10) Patent No.: US 11,581,812 B2
(45) Date of Patent: Feb. 14, 2023

(54) MULTI-PHASE POWER CONVERTER, CONTROL CIRCUIT AND CONTROL METHOD THEREOF

(71) Applicant: Silergy Semiconductor Technology (Hangzhou) LTD, Hangzhou (CN)

(72) Inventors: Kaiwei Yao, Sunnyvale, CA (US); Zhiyuan Shen, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 25 days.

(21) Appl. No.: 16/894,815

(22) Filed: Jun. 7, 2020

(65) Prior Publication Data
US 2020/0395854 A1 Dec. 17, 2020

(30) Foreign Application Priority Data
Jun. 13, 2019 (CN) .......................... 201910512285.X (51) Int. Cl.
*H02M 3/158* (2006.01)
*G01R 19/165* (2006.01)
(Continued)

(52) U.S. Cl.
CPC .... *H02M 3/1584* (2013.01); *G01R 19/16528* (2013.01); *G01R 19/175* (2013.01);
(Continued)

(58) Field of Classification Search
CPC ....... H02M 3/156–158; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/1588; H02M 2003/1566; H02M 3/1582; H02M 2003/1557; G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56;
(Continued)

(56) References Cited

U.S. PATENT DOCUMENTS 5,528,481 A 6/1996 Caldeira et al.
6,628,106 B1 * 9/2003 Batarseh ............. H02M 3/1584
                                                323/284

(Continued)

FOREIGN PATENT DOCUMENTS

| CN | 106416034 A | 2/2017 |
| CN | 206259862 U | 6/2017 |
| TW | 550444 B1 * | 9/2016 |

*Primary Examiner* — Thienvu V Tran
*Assistant Examiner* — Nusrat Quddus (57) ABSTRACT

A method of controlling a multi-phase power converter having a plurality of power stage circuits coupled in parallel, can include: obtaining a load current of the multi-phase power converter; enabling corresponding power stage circuits to operate in accordance with the load current, such that a switching frequency is maintained within a predetermined range when the load current changes; and controlling the power stage circuits to operate under different modes in accordance with the load current, such that the switching frequency is maintained within the predetermined range when the load current changes.

20 Claims, 8 Drawing Sheets

(51) Int. Cl.
   *G01R 19/175* (2006.01)
   *H02M 1/084* (2006.01)
   *H02M 1/32* (2007.01)
   *H02M 1/00* (2006.01)

(52) U.S. Cl.
   CPC ........... *H02M 1/0845* (2013.01); *H02M 1/32* (2013.01); *H02M 1/0009* (2021.05); *H02M 1/0025* (2021.05)

(58) Field of Classification Search
   CPC ..... G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H05B 39/048; B23K 11/24; H04B 2215/069
   See application file for complete search history.

(56) References Cited

U.S. PATENT DOCUMENTS

| | | | |
|---|---|---|---|
| 7,292,013 B1* | 11/2007 | Chen | G05F 1/70 323/299 |
| 7,317,305 B1* | 1/2008 | Stratakos | H02M 3/1584 323/282 |
| 8,080,987 B1* | 12/2011 | Qiu | H02M 3/156 323/284 |
| 8,098,505 B1* | 1/2012 | Choi | H02M 1/4225 323/272 |
| 8,310,846 B2 | 11/2012 | Piazzesi | |
| 8,710,810 B1* | 4/2014 | McJimsey | H02M 3/158 323/283 |
| 8,917,068 B2 | 12/2014 | Chen et al. | |
| 9,263,955 B2 | 2/2016 | Schmid et al. | |
| 9,331,588 B2 | 5/2016 | Chen | |
| 9,614,444 B2* | 4/2017 | Babazadeh | H02M 3/1584 |
| 9,654,007 B1* | 5/2017 | Childs | H02M 3/1584 |
| 9,762,113 B2 | 9/2017 | Chen et al. | |
| 10,396,673 B1* | 8/2019 | Presti | H02M 1/38 |
| 10,491,106 B2 | 11/2019 | Bhandarkar et al. | |
| 10,778,101 B1* | 9/2020 | Schmitz | H02M 3/1584 |
| 2002/0191431 A1* | 12/2002 | Huang | H04L 7/0337 363/148 |
| 2008/0094113 A1* | 4/2008 | Kuan | H03K 23/68 327/117 |
| 2014/0002932 A1* | 1/2014 | Tang | H02M 1/32 361/18 |
| 2014/0062433 A1* | 3/2014 | Zhou | H02M 3/1584 323/271 |
| 2014/0232368 A1* | 8/2014 | Dally | H02M 3/155 323/311 |
| 2014/0334196 A1* | 11/2014 | Chen | H02M 3/1584 363/21.04 |
| 2015/0078041 A1 | 3/2015 | Huang | |
| 2015/0263614 A1* | 9/2015 | Bansal | H02M 3/1584 323/282 |
| 2015/0280560 A1* | 10/2015 | Guo | H02M 3/1584 323/271 |
| 2015/0280563 A1* | 10/2015 | Tang | H02M 3/1584 323/271 |
| 2015/0303799 A1* | 10/2015 | Tang | H02M 3/1584 323/271 |
| 2015/0311810 A1 | 10/2015 | Chen et al. | |
| 2015/0349634 A1* | 12/2015 | Tschirhart | H02M 3/158 702/64 |
| 2015/0357913 A1* | 12/2015 | Tschirhart | H02M 3/158 323/282 |
| 2016/0013719 A1* | 1/2016 | Babazadeh | H02M 3/157 323/271 |
| 2016/0233766 A1* | 8/2016 | Todorov | H02M 3/1584 |
| 2016/0365791 A1* | 12/2016 | Childs | H02M 3/158 |
| 2017/0047853 A1 | 2/2017 | Chen et al. | |
| 2017/0098998 A1* | 4/2017 | Zhou | H02M 3/1584 |
| 2017/0248996 A1* | 8/2017 | Zhang | G06F 1/26 |
| 2017/0317595 A1* | 11/2017 | Babazadeh | H02M 3/33592 |
| 2017/0324332 A1* | 11/2017 | Molari | G05F 1/46 |
| 2018/0013348 A1* | 1/2018 | Paul | H02M 3/157 |
| 2018/0048232 A1* | 2/2018 | Adell | H02M 3/157 |
| 2018/0136255 A1* | 5/2018 | Albert | G01R 31/2806 |
| 2018/0294726 A1* | 10/2018 | Priego | H02M 3/1584 |
| 2019/0107853 A1* | 4/2019 | You | H02M 3/1584 |
| 2019/0207518 A1* | 7/2019 | Wu | G01R 29/033 |
| 2019/0273439 A1* | 9/2019 | Desai | H02M 3/1584 |
| 2019/0393786 A1* | 12/2019 | Chang | H02M 3/1584 |
| 2020/0295649 A1* | 9/2020 | Ashourloo | H02M 3/335 |
| 2020/0412233 A1* | 12/2020 | Shen | H02M 3/1584 |
| 2021/0050789 A1* | 2/2021 | Gelman | G05F 1/59 |
| 2021/0167780 A1* | 6/2021 | Mannes Hillesheim | H02M 3/1584 |

* cited by examiner

MULTI-PHASE POWER CONVERTER, CONTROL CIRCUIT AND CONTROL METHOD THEREOF

RELATED APPLICATIONS

This application claims the benefit of Chinese Patent Application No. 201910512285.X, filed on Jun. 13, 2019, which is incorporated herein by reference in its entirety.

FIELD OF THE INVENTION

The present invention relates to the field of power electronics, and more particularly to multi-phase power converters and associated control circuits and methods.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

With the development of central processing unit (CPU), general processing unit (GPU), and artificial intelligence (AI) chips and devices, power supply circuits with low voltage, large current, high efficiency, and small volume are widely used. However, the miniaturization of the circuitry typically results in an increase in the switching frequency switching loss of the power switches, and a decrease in the operation efficiency. When the power converter operates in a current critical conduction mode, the main power switch of the power converter can realize zero-voltage switching. In such a case, the on loss of the main power switch can be decreased, such that the power converter can operate at a higher switching frequency with the same operation efficiency. However, the switching frequency can vary widely along with the change of the load, which is not conducive for improvement of the operation efficiency within the full load range.

In one embodiment, a method of controlling a multi-phase power converter having a plurality of power stage circuits coupled in parallel, can include: (i) obtaining a load current of the multi-phase power converter; (ii) enabling corresponding power stage circuits to operate in accordance with the load current, such that a switching frequency is maintained within a predetermined range when the load current changes; and (iii) controlling the power stage circuits to operate under different modes in accordance with the load current, such that the switching frequency is maintained within the predetermined range when the load current changes. In one embodiment, an apparatus can include: (i) a multi-phase power converter having a plurality of power stage circuits coupled in parallel; and (ii) a control circuit configured to enable corresponding of the plurality of power stage circuits to operate in accordance with a load current, such that a switching frequency is maintained within a predetermined range when the load current changes.

Figure 1:
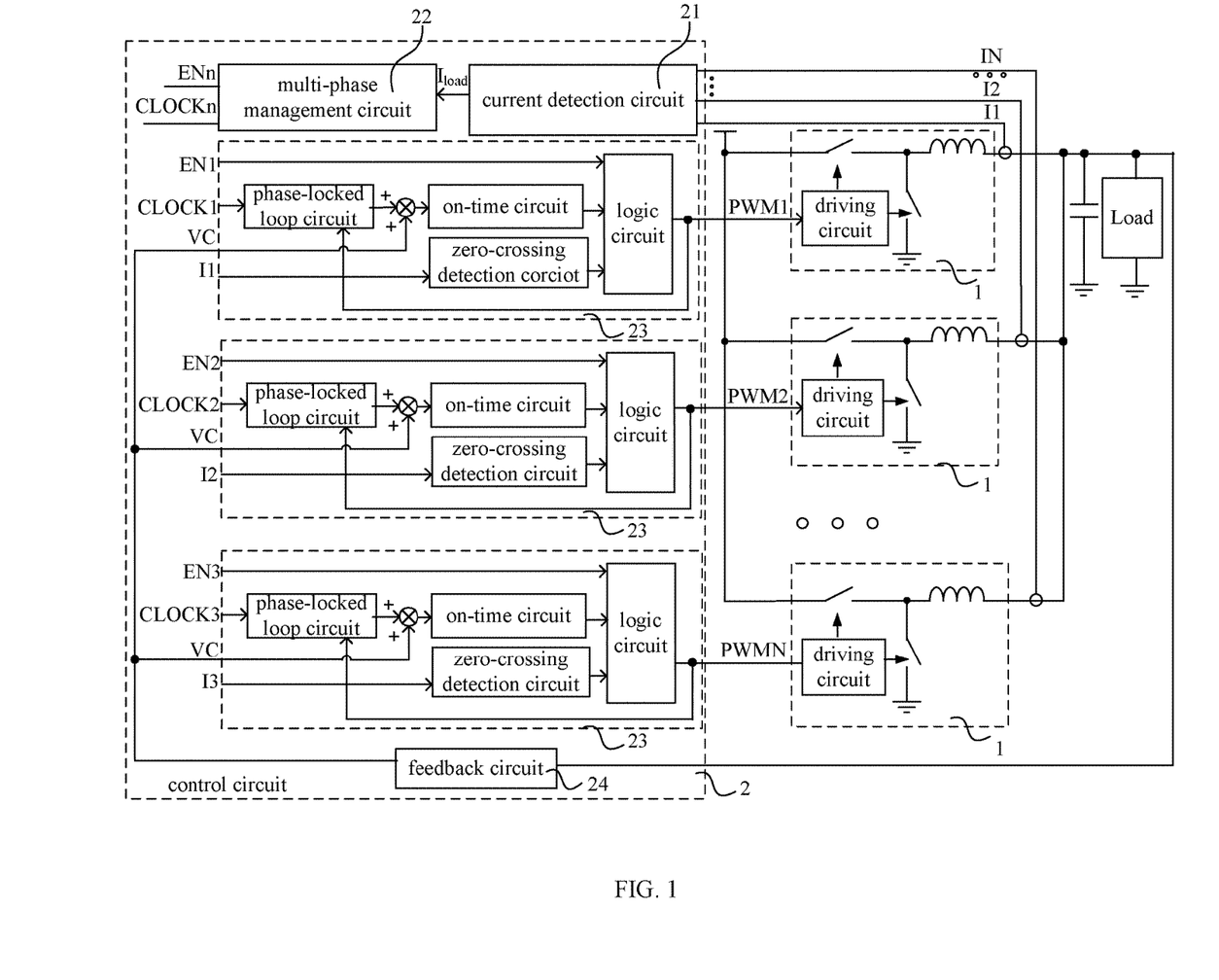
FIG. 1 is a schematic block diagram of an example multi-phase power converter, in accordance with the embodiments of the present invention.

Referring now to FIG. 1, shown is a schematic block diagram of an example multi-phase power converter, in accordance with the embodiments of the present invention. In this particular example, the multi-phase power converter can include multiple power stage circuits 1 coupled in parallel and control circuit 2. Here, control circuit 2 can enable power stage circuits 1 to operate by load current Iload, such that switching frequency (f) of the multi-phase power converter can be maintained within a predetermined range when load current Iload changes. Further, the number of the enabled power stage circuits can increase as load current Iload increases. For example, control circuit 2 can control the power stage circuits to be enabled to operate according to the range to which load current Iload belongs, such that switching frequency f can be maintained within the predetermined range when load current Iload changes. For example, control circuit 2 can include current detection circuit 21, multi-phase management circuit 22, and multiple single-phase control circuits 23, respectively corresponding to multiple power stage circuits 1 and feedback circuit 24. The power stage circuits with the number N, where N is a positive integer are shown in this particular example. Current detection circuit 21 can detect multiple phase currents I1, I2 . . . IN, respectively corresponding to multiple power stage circuits 1, in order to obtain load current Iload according to the sum of multiple phase currents I1, I2 . . . IN.

Multi-phase management circuit 22, can generate multiple enable signals EN1, EN2 . . . ENN and multiple clock signals CLOCK1, CLOCK2 . . . CLOCKN, respectively corresponding to multiple power stage circuits 1 according to load current Iload. Here, enable signal ENn (n=1,2 . . . N) can enable corresponding power stage circuit 1 to operate. For example, when enable signal ENn is active, the corresponding power stage circuit 1 may be enabled to operate normally, and when enable signal ENn is inactive, the corresponding power stage circuit 1 may be disabled and stops operating. In addition, clock signal CLOCKn (n=1, 2 . . . N) can adjust the on time of a main power switch of the corresponding power stage circuit 1 through a phase-locked loop circuit, in order to perform a phase adjustment. Therefore, each power stage circuit 1 may operate with a corresponding predetermined phase to meet other requirements of a system.

Multiple single-phase control circuits 23 can respectively correspond to multiple power stage circuits 1. For example, each single-phase control circuit 23 can generate a pulse-width modulation (PWM) control signal according to corresponding phase current "In" (n=1,2 . . . N), feedback signal VC, and enable signal ENn (n=1,2 . . . N), in order to control corresponding power stage circuit 1 to operate. It should be understood that the generation of the control signal may also utilize clock signal CLOCKn to control each power stage circuit 1 to operate with a corresponding predetermined phase. Feedback circuit 24 can generate an error compensation signal as feedback signal VC according to output voltage Vo of the multi-phase power converter and reference voltage Vref. In particular embodiments, the multiple power stage circuits of the multi-phase power converter can be enabled by the load current, such that the switching frequency can be maintained within a predetermined range when the load current changes.

Figure 2:
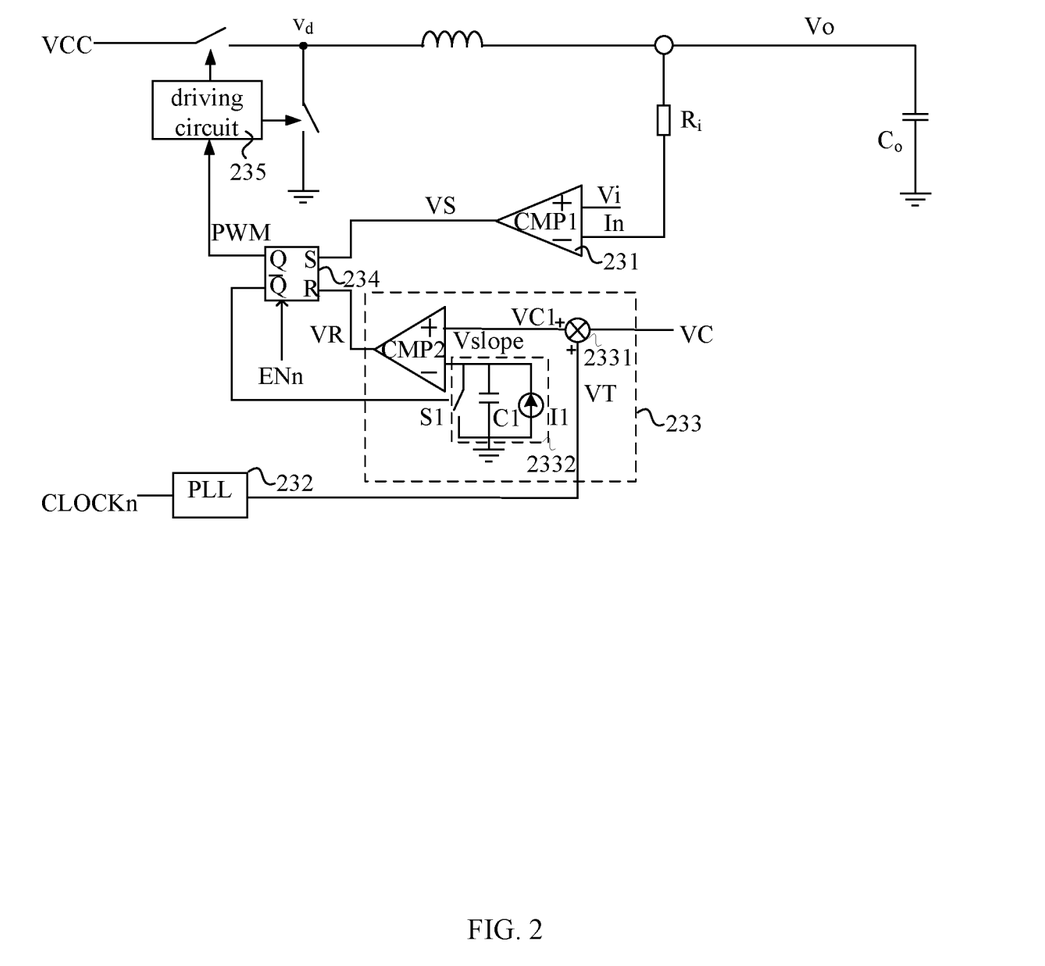
FIG. 2 is a schematic block diagram of a first example single-phase control circuit of the multi-phase power converter, in accordance with the embodiments of the present invention.
Figure 3:
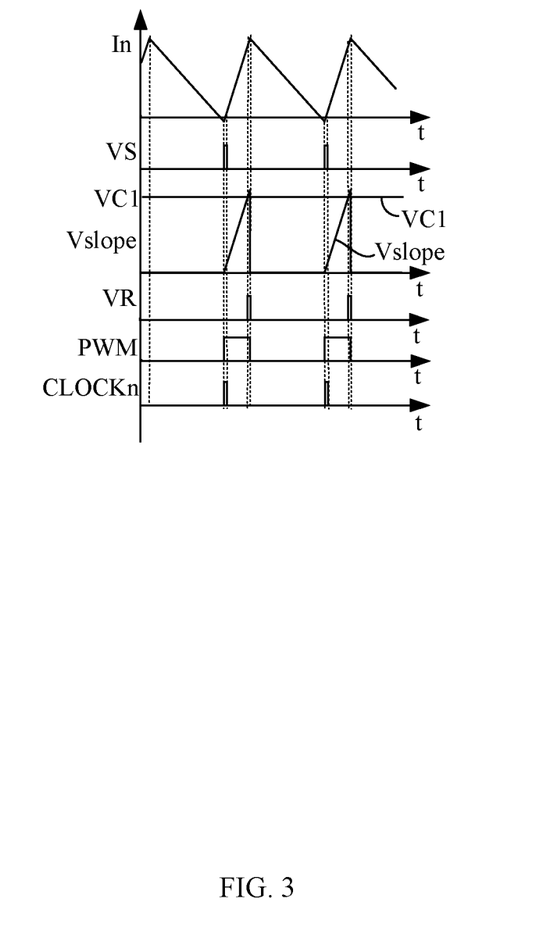
FIG. 3 is a waveform diagram of a first example operation of the multi-phase power converter, in accordance with the embodiments of the present invention.

Referring now to FIG. 2, shown is a schematic block diagram of a first example single-phase control circuit of the multi-phase power converter, in accordance with the embodiments of the present invention. Referring also to FIG. 3, shown is a waveform diagram of a first operation example of the multi-phase power converter, in accordance with the embodiments of the present invention. In this example, the multi-phase power converter can operate in a critical conduction mode; that is, the main power switch of power stage circuit 1 may be turned on when phase current In is detected to be zero. For example, each single-phase control circuit 23 can include zero-crossing detection circuit 231, phase-locked loop circuit 232, on-time circuit 223, and logic circuit 234.

Zero-crossing detection circuit 231 can detect whether phase current In is less than predetermined current threshold Vi, and may generate a current detection signal. In this example, the current detection signal is set signal VS, and when phase current In is less than predetermined current threshold Vi, set signal VS can be active. Under the critical conduction mode, the main power switch of power stage circuit 1 may be turned on when phase current In is detected to be zero. Therefore, predetermined current threshold Vi can be set to be zero or slightly less than zero. Further, when phase current In decreases to be less than predetermined current threshold Vi, this may represent that phase current In becomes negative after crossing zero, such that set signal VS is active to turn on the main power switch of power stage circuit 1.

For example, zero-crossing detection circuit 231 can include comparator CMP1. For example, a non-inverting input terminal of comparator CMP1 can receive predetermined current threshold Vi, and an inverting input terminal of comparator CMP1 can receive phase current In. Comparator CMP1 may generate a comparison signal with a high level when phase current In decreases to be less than predetermined current threshold Vi, where the comparison signal is taken as set signal VS. In particular embodiments, phase current In can be acquired by sampling resistor Ri, or in other ways that can realize the active sampling of the inductor current of power stage circuit 1.

Phase-locked loop circuit 232 can generate clock adjustment signal VT according to clock signal CLOCKn and a corresponding PWM control signal, thereby adjusting the on time of main power switch of power stage circuit 1 with feedback signal VC to perform a phase adjustment, such that the control signals of the multiple power stage circuits 1 can keep the same frequency and phase with the corresponding clock signal CLOCKn. On-time circuit 233 can generate reset signal VR according to feedback signal VC, clock adjustment signal VT, and ramp signal Vslope.

On-time circuit 233 can include superimposing circuit 2331, ramp signal generation circuit 2332, and comparator CMP2. For example, superimposing circuit 2331 may superimpose clock adjustment signal VT and feedback signal VC in order to generate feedback signal VC1. In this example, superimposing circuit 2331 is formed by an adder circuit. Moreover, ramp signal generation circuit 2332 can include switch S1, capacitor C1, and current source I1 coupled in parallel. Here, switch S1 is controlled by the PWM control signal generated from logic circuit 234. In this example, switch S1 can be turned off when the main power switch of power stage circuit 1 is turned on. Therefore, current source I1 can charge capacitor C1 and the voltage of capacitor C1 may gradually increase. In this period, phase current In (e.g., the inductor current) of power stage circuit 1 can linearly increase due to the conduction of the main power switch, as shown in FIG. 3.

Thus, the voltage across capacitor C1 can be changed in synchronization with the inductor current of power stage circuit 1 when the parameters are accordingly set. Further, switch S1 may be turned on when the main power switch of power stage circuit 1 is turned off, such that capacitor C1 discharges and the voltage across capacitor C1 decreases to be zero. With the process above repeated, ramp signal Vslope can be generated at a first terminal of capacitor C1. In addition, a non-inverting input terminal of comparator CMP2 can receive ramp signal Vslope, and an inverting input terminal of comparator CMP2 can receive feedback signal VC1. When ramp signal Vslope increases to be the same level as feedback signal VC1, comparator CMP2 may generate a comparison signal with a high level, which may be taken as reset signal VR to control the main power switch of power stage circuit 1 to be off.

Logic circuit 234 can generate the PWM control signal according to reset signal VR, set signal VS and enable signal ENn. For example, logic circuit 234 can include a SR flip-flop. For example, set terminal S of the SR flip-flop can receive set signal VS, reset terminal R of the SR flip-flop can receive reset signal VR, and output terminal Q of the SR flip-flop may generate the PWM control signal. Here, enable signal ENn can control the operation states of logic circuit 234. For example, when enable signal ENn is active, logic circuit 234 may operate normally and can generate the PWM control signal, such that the corresponding power stage circuit can be controlled to operate according to the PWM control signal. When enable signal ENn is inactive, logic circuit 234 may stop operating and not generate the PWM control signal, such that the corresponding power stage circuit may be disabled and stop operating. Single-phase control circuit 23 can also include driving circuit 235. Driving circuit 235 can receive the PWM control signal, and may convert the PWM control signal into a driving signal to control the main power switch of power stage circuit 1 to be on/off. In some examples, enable signal ENn can be configured to control driving circuit 235 to be enabled or disabled, thereby controlling the operation states of corresponding power stage circuit 1.

Figure 4:
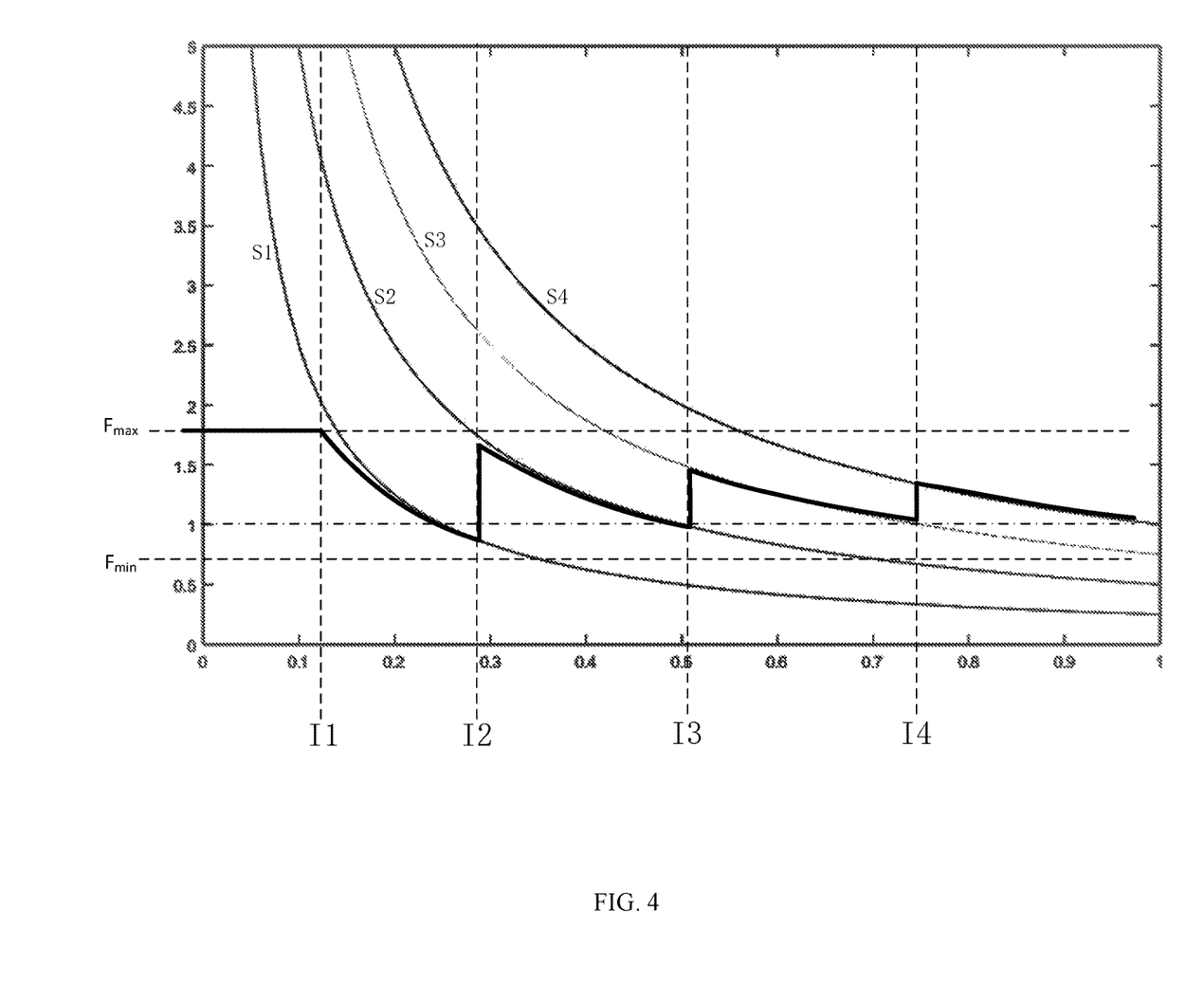
FIG. 4 is a current-frequency curve diagram of the example multi-phase power converter, in accordance with the embodiments of the present invention.

Referring now to FIG. 4, shown is a current-frequency curve diagram of the example multi-phase power converter, in accordance with the embodiments of the present invention. Combining with FIG. 4 and taking the four-phase power converter (e.g., the number of the power stage circuits is 4) as an example, the operation method for the multi-phase power converter will be illustrated as follows. Since the power stage circuits of the multi-phase power converter usually operate under the critical conduction mode, the switching frequency of a certain power stage circuit can be inversely proportional to load current Iphase of corresponding power stage circuit; that is, single-phase switching frequency Fsw is equal to K/Iphase. In such a case, single-phase load current Iphase may vary with the number of phases N in the multi-phase power converter and is equal to Iload/N. In addition, single-phase switching frequency Fsw can be expressed by N*K/Iphase. Both the single-phase switching frequency and single-phase load current Iphase may be set to be 1 at full load to realize standardization. In that case, K may be equal to Imax/N.

Firstly, a total load current-switching frequency curve can be determined according to the number of the power stage circuits to operate. As shown in FIG. 4, the total load current-switching frequency curve is S1 when one power stage circuit operates, the total load current-switching frequency curve is S2 when two power stage circuits operate, the total load current-switching frequency curve is S3 when three power stage circuits operate, and the total load current-switching frequency curve is S4 when four power stage circuits operate. It can be seen from the total load current-switching frequency curves S1-S4 that the switching frequency tends to increase with the decrease of the load. Thus, the switching frequency can decrease as the number of power stage circuits properly decreases.

Secondly, the number of power stage circuits to operate may properly be determined according to the current range to which load current Iload belongs, such that the switching frequency can be maintained within the predetermined range at each current range. That is, the switching frequency can be between minimum frequency Fmin and maximum frequency Fmax. Moreover, minimum frequency Fmin and maximum frequency Fmax can be set in accordance with the particular application and operation status of the multi-phase power converter.

As such, the better selection way is that both four power stage circuits operate under the critical conduction mode when load current Iload is greater than operation point I4, three power stage circuits operate under the critical conduction mode when load current Iload is greater than operation point I3 and less than operation point I4, two power stage circuits operate under the critical conduction mode when load current Iload is greater than operation point I2 and less than operation point I3, and one power stage circuit operates under the critical conduction mode when load current Iload is greater than operation point I1 and less than operation point I2. As a result, the switching frequency can be controlled between minimum frequency Fmin and maximum frequency Fmax.

As discussed above, when the power converter operates under the critical conduction mode, the main power switch of the power converter can realize zero-voltage-switching. In such a case, the on loss of the main power switch can be decreased, such that the power converter may operate at a higher switching frequency with a same operation efficiency. However, the switching frequency can change widely with the change of the load, which may not be conducive to the improvement of the operation efficiency within the full load range. In particular embodiments, the multiple power stage circuits of the power converter can be enabled to operate by the load current, such that the switching frequency can be maintained within a predetermined range when the load current changes. Thus, the disadvantages that the switching frequency is low and the conduction current is great can be substantially overcome in the single-phase critical conduction power converter with heavy load. Moreover, the problem of the switching frequency being high and the operating efficiency being low in the multi-phase critical conduction power converter with heavy load can be substantially overcome. In addition, the switching frequency can be reduced in the single-phase critical conduction power converter in the discontinuous current conduction mode, such that the multi-phase critical conduction power converter can operate efficiently within the full load range.

Figure 5:
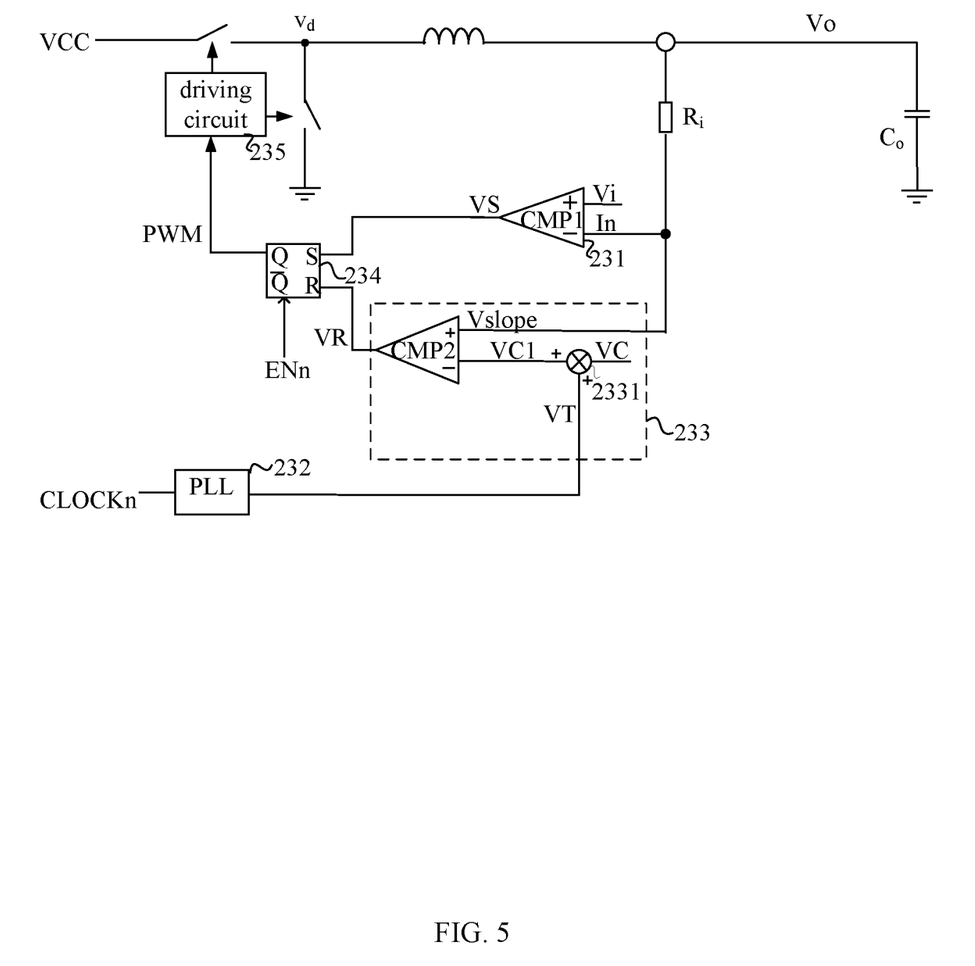
FIG. 5 is a schematic block diagram of a second example single-phase control circuit of the multi-phase power converter, in accordance with the embodiments of the present invention.
Figure 6:
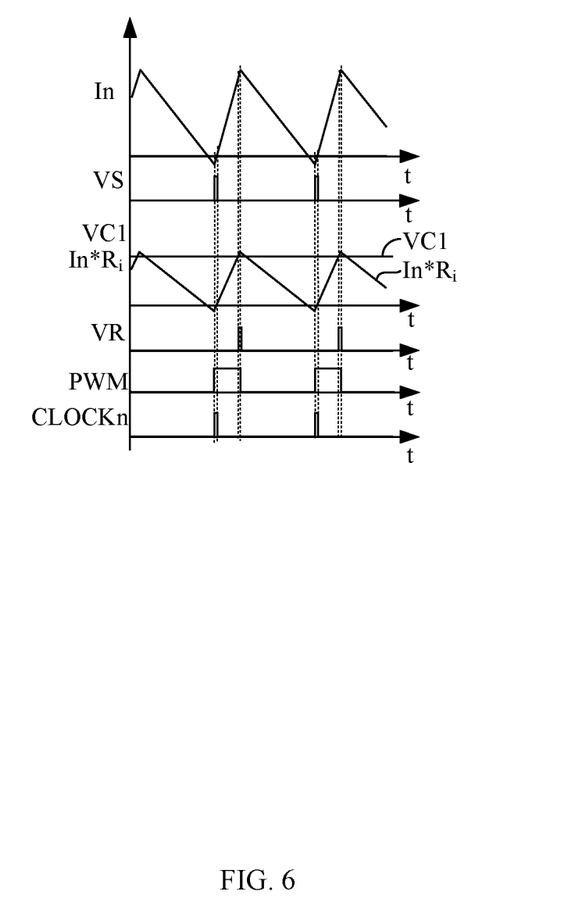
FIG. 6 is a waveform diagram of a second example operation of the multi-phase power converter, in accordance with the embodiments of the present invention.

Referring now to FIG. 5, shown is a schematic block diagram of a second example single-phase control circuit of the multi-phase power converter, in accordance with the embodiments of the present invention. Referring also to FIG. 6, shown is a waveform diagram of a second example operation of the multi-phase power converter, in accordance with the embodiments of the present invention. Here, the difference between the first and second examples is that sampling signal In*Ri representing inductor current In is directly taken as ramp signal Vslope. As shown, the non-inverting input terminal of comparator CMP2 can receive sampling signal In*Ri representing inductor current In, and the inverting input terminal of comparator CMP2 can receive feedback signal VC1. Comparator CMP2 may generate a comparison signal with a high level when ramp signal Vslope increases to be the level of feedback signal VC1, and the comparison signal may be taken as reset signal VR to control the main power switch to be off.

Figure 7:
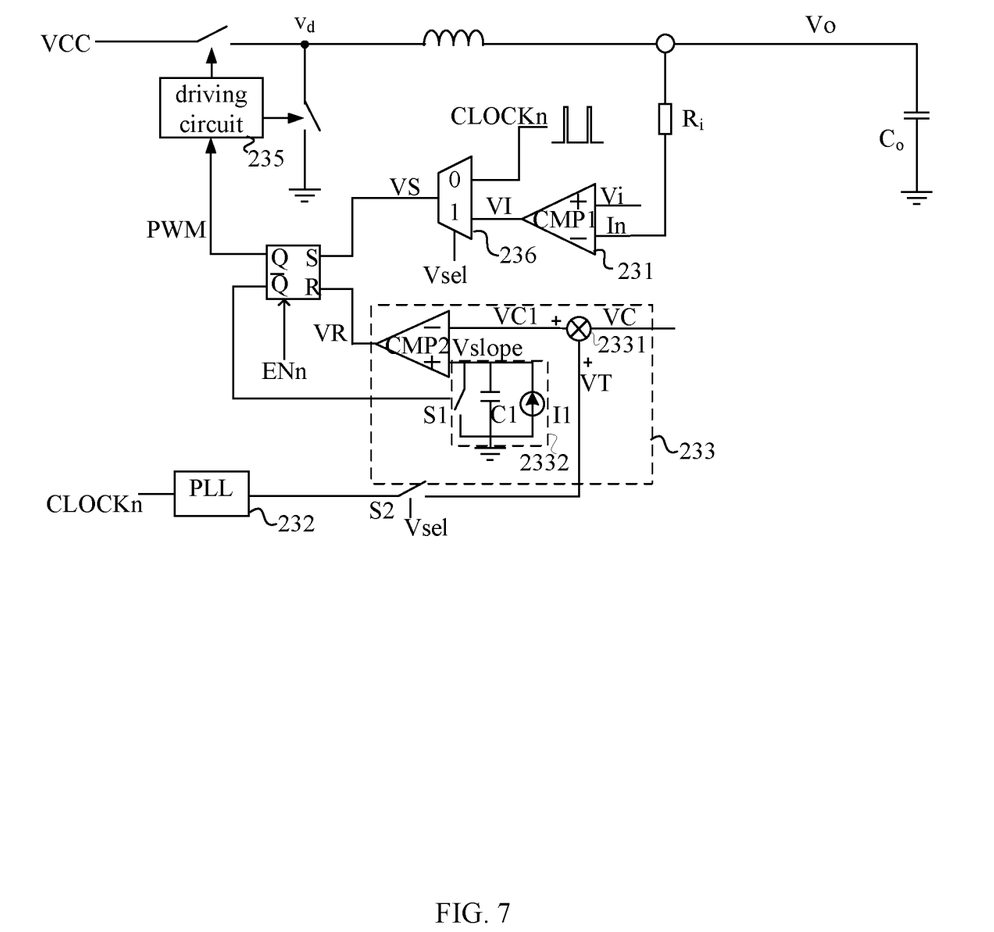
FIG. 7 is a schematic block diagram of a third example single-phase control circuit of the multi-phase power converter, in accordance with the embodiments of the present invention.
Figure 8:
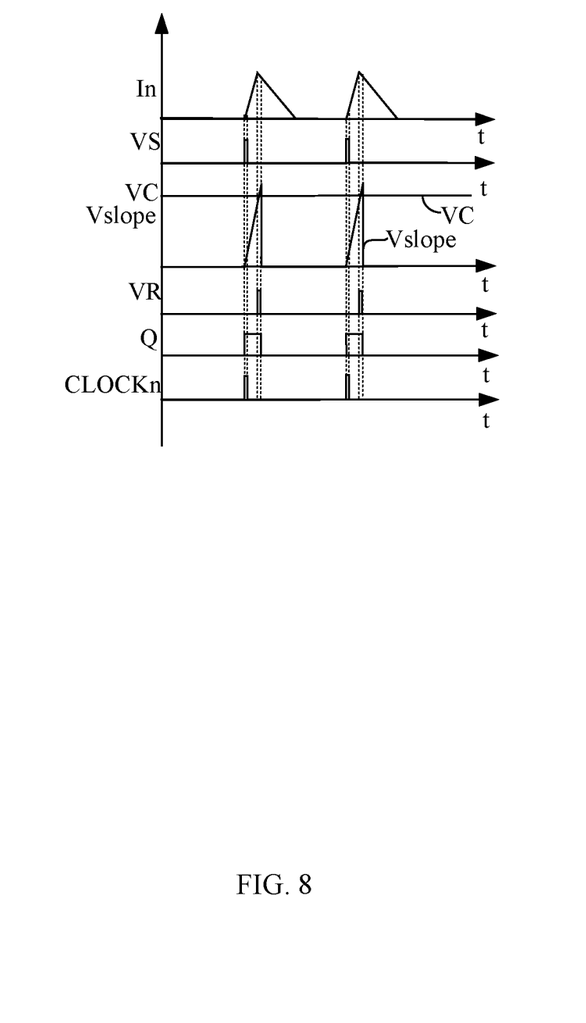
FIG. 8 is a waveform diagram of the example multi-phase power converter, in accordance with the embodiments of the present invention.

Referring now to FIG. 7, shown is a schematic block diagram of a third example single-phase control circuit of the multi-phase power converter, in accordance with the embodiments of the present invention. Referring also to FIG. 8, shown is a waveform diagram of a third example operation of the example multi-phase power converter, in accordance with the embodiments of the present invention. When load current Iload is greater than threshold V1, corresponding power stage circuit 1 can operate under the critical conduction mode. When load current Iload is less than threshold V1, corresponding power stage circuit 1 operates under a discontinuous current conduction mode or a frequency modulation mode, in order to improve operation efficiency. Here, threshold V1 can be set according to particular application requirements, and operation point I1 can directly serve as threshold V1.

Referring back to FIG. 4, when load current Iload is less than operation point I1, the switching frequency can be greater than maximum frequency Fmax. Single-phase control circuit 23 can control corresponding power stage circuit 1 to stop operating under the critical conduction mode and switch to operate under the discontinuous current conduction mode, the frequency modulation mode, or another more active operation mode.

In particular embodiments, the discontinuous current conduction mode may be added based on the critical conduction mode to illustrate an example operation method of the multi-phase power converter. For example, selection circuit 236 may be provided after zero-crossing detection circuit 231, and can choose one of clock signal CLOCKn and current detection signal VI as set signal VS, and output set signal VS according to the relationship between load current Iload and threshold V1. In that case, input terminals of selection circuit 236 may respectively receive clock signal CLOCKn and current detection signal VI, and an output terminal of selection circuit 236 can selectively output one of clock signal CLOCKn and current detection signal VI according to selection signal Vsel.

For example, selection signal Vsel may be inactive when load current Iload is less than threshold V1, which may represent that the power stage circuit can switch to operate under the discontinuous current conduction mode. In that case, selection circuit 236 can choose clock signal CLOCKn as set signal VS, and may output set signal VS to control the main power switch to be on. Further, selection signal Vsel can be active when load current Iload is greater than threshold V1, which may represent that the power stage circuit can switch to operate under the critical conduction mode. In that case, selection circuit 236 can choose current detection signal VI as set signal VS, in order to control the main power switch to be on.

Current detection signal VI can be generated by clock signal CLOCKn when load current Iload is less than threshold V1, such that multiple power stage circuits 1 can keep the same frequency and phase as the clock signal. Therefore, reset signal VR can be generated without clock signal CLOCKn in this particular example. For example, switch S2 may be arranged between phase-locked loop circuit 232 and superimposing circuit 233, and can be controlled by selection signal Vsel. Switch S2 may be turned off by inactive selection signal Vsel when load current Iload is less than threshold V1, such that clock adjustment signal VT may not influence feedback signal VC. As can be seen from FIG. 8, when load current Iload is less than threshold V1, the transition time of set signal VS may be consistent with (e.g., the same as) clock signal CLOCKn. Also, the transition time may not be influenced by (e.g., can be independent of) the inductor current crossing zero. In addition, reset signal VR can be obtained by comparing ramp signal Vslope against feedback signal VC.

Particular embodiments involve a multi-phase power converter, a control circuit, and/or a control method thereof as discussed. For the multi-phase power converter, multiple power stage circuits can be enabled to operate under critical conduction mode by a load current, such that the switching frequency can be maintained within a predetermined range when the load current changes. Thus, when a single-phase power converter operates under critical conduction mode with heavy load, the disadvantages of low switching frequency and large conduction current can be substantially avoided. Moreover, when the multi-phase power converter operates under critical conduction mode with a light load, the disadvantages of high switching frequency and low working efficiency can be substantially avoided. In addition, the switching frequency of the single-phase power converter under discontinuous current conduction mode can be reduced, such that the multi-phase power converter can operate efficiently within the full load range.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of controlling a multi-phase power converter having a plurality of power stage circuits coupled in parallel, the method comprising:
   a) obtaining a load current of the multi-phase power converter;
   b) generating a plurality of enable signals for enabling corresponding power stage circuits to operate in accordance with the load current, such that a switching frequency is maintained within a predetermined range when the load current changes;
   c) wherein when more than one of the power stage circuits is enabled, each enabled power stage circuit operates in a critical conduction mode, and a main power switch of each enabled power stage circuit is turned on when a phase current corresponding to the power stage circuit drops to zero and is turned off according to a feedback signal; and
   d) generating a plurality of clock signals corresponding to the plurality of power stage circuits to perform a phase adjustment.

2. The method of claim 1, wherein the number of the enabled power stage circuits increases as the load current increases.

3. The method of claim 1, further comprising enabling the power stage circuits according to the range in which the load current belongs, such that the switching frequency is maintained within the predetermined range when the load current changes.

4. The method of claim 3, wherein a number of the enabled power stage circuits increases by at least one when the range to which the load current belongs increases by one level.

5. The method of claim 1, further comprising detecting a plurality of phase currents corresponding to the plurality of power stage circuits and obtaining the load current according to a sum of the plurality of phase currents.

6. The method of claim 1, wherein under the critical conduction mode, the main power switch of each enabled power stage circuit is turned off according to a feedback signal and a corresponding clock signal.

7. The method of claim 1, further comprising controlling the power stage circuit to operate under different modes, in accordance with a relationship between the load current and a first threshold.

8. The method of claim 7, further comprising controlling the power stage circuit to operate under the critical conduction mode when the load current is greater than the first threshold.

9. The method of claim 7, further comprising:
   a) controlling the power stage circuit to operate under a discontinuous current conduction mode or a frequency modulation mode when the load current is less than the first threshold; and
   b) turning on the main power switch of the power stage circuit according to a corresponding one of the plurality of clock signals.

10. The method of claim 7, further comprising:
a) detecting whether the phase current is less than a predetermined current threshold to generate a current detection signal;
b) generating a clock adjustment signal according to a corresponding one of the plurality of clock signals;
c) generating a reset signal according to the feedback signal to control the main power switch to be turned off; and
d) generating a pulse-width modulation (PWM) control signal according to the reset signal, a set signal, and the enable signal.

11. The method of claim 10, further comprising choosing one of the corresponding clock signal and the current detection signal as the set signal according to a relationship between the load current and the first threshold.

12. The method of claim 11, wherein:
a) when the power stage circuit operates under the critical conduction mode, the set signal is the current detection signal, and the reset signal is generated according to a ramp signal and the sum of the feedback signal and the corresponding clock signal; and
b) when the power stage circuit operates under a discontinuous current conduction mode or a frequency modulation mode, the set signal is the clock signal, and the reset signal is generated according to the feedback signal and the ramp signal.

13. The method of claim 12, wherein the ramp signal rises synchronously with the phase current.

14. An apparatus, comprising:
a) a multi-phase power converter having a plurality of power stage circuits coupled in parallel;
b) a control circuit configured to generate a plurality of enable signals to enable corresponding of the plurality of power stage circuits to operate in accordance with a load current, such that a switching frequency is maintained within a predetermined range when the load current changes, wherein when more than one of the power stage circuits is enabled, each enabled power stage circuit operates in a critical conduction mode, and a main power switch of each enabled power stage circuit is turned on when a phase current corresponding to the power stage circuit drops to zero; and
c) the control circuit being configured to generate a plurality of clock signals corresponding to the plurality of power stage circuits to perform a phase adjustment.

15. The apparatus of claim 14, wherein the number of the enabled power stage circuits increases as the load current increases.

16. The apparatus of claim 14, wherein the control circuit further comprises a current detection circuit configured to detect the plurality of phase currents corresponding to the plurality of power stage circuits, and to obtain the load current according to the sum of the plurality of phase currents.

17. The apparatus of claim 14, wherein the control circuit further comprises a multi-phase management circuit configured to generate the plurality of enable signals corresponding to the plurality of power stage circuits according to the load current, in order to enable the plurality of power stage circuits.

18. The apparatus of claim 14, wherein the control circuit further comprises:
a) a plurality of single-phase control circuits corresponding to the plurality of power stage circuits; and
b) wherein each of the plurality of single-phase control circuits is configured to control switching states of power switches in a corresponding power stage circuit.

19. The apparatus of claim 14, wherein the power stage circuit is controlled to operate under the critical conduction mode when the load current is greater than a first threshold, and to operate under a discontinuous current conduction mode or a frequency modulation mode when the load current is less than the first threshold.

20. A power converting circuit, comprising the apparatus of claim 14.

* * * * *